Figure 1:
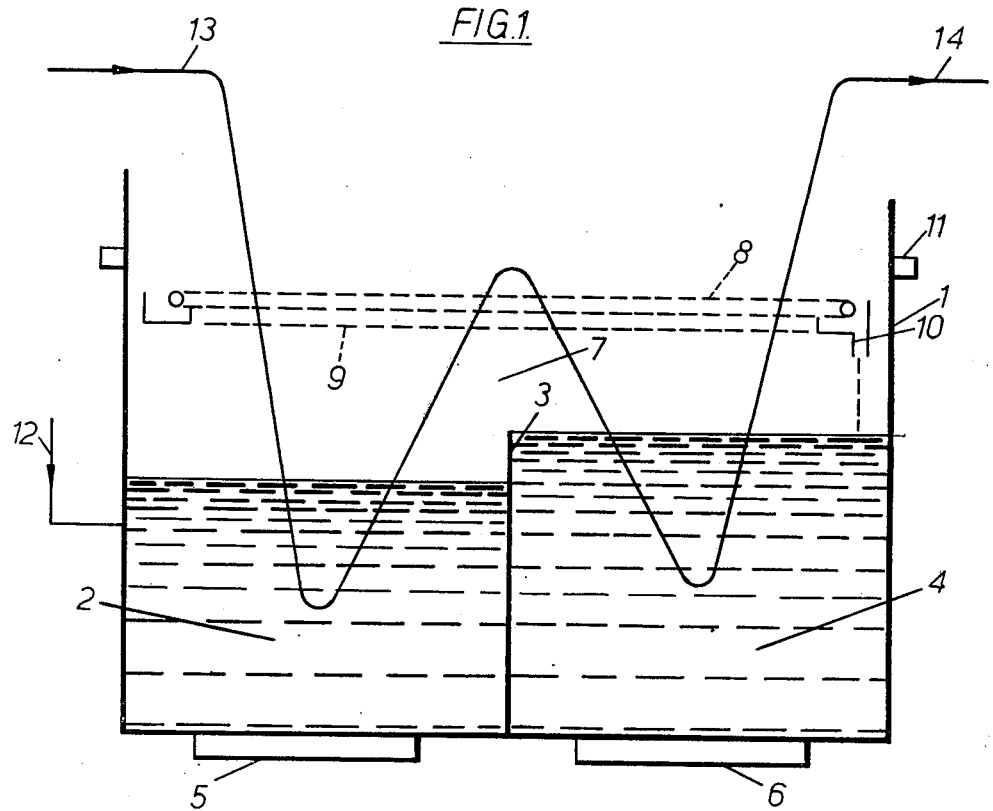

United States Patent [19]

Tipping et al.

[11] 3,957,531

[45] May 18, 1976

[54] TWO TANK CLEANING PROCESS USING A CONTAMINATED CLEANING MIXTURE CAPABLE OF FORMING AN AZEOTROPE

[75] Inventors: James William Tipping; Bernard Patrick Whim, both of Runcorn, England

[73] Assignee: Imperial Chemical Industries Limited, London, England

[22] Filed: Mar. 14, 1975

[21] Appl. No.: 558,380

Related U.S. Application Data

[63] Continuation of Ser. No. 289,113, Sept. 14, 1972, abandoned.

[30] Foreign Application Priority Data

Sept. 27, 1971 United Kingdom............... 44876/71

[52] U.S. Cl..................................... 134/11; 134/12; 134/26; 134/30; 134/31; 134/38; 252/171
[51] Int. Cl.[2]........................ B08B 3/08; B08B 3/10
[58] Field of Search ................... 134/11, 12, 15, 31, 134/26, 10, 30, 38; 252/171

[56] References Cited
UNITED STATES PATENTS

| | | | |
|---|---|---|---|
| 2,153,577 | 4/1939 | Levine .................................. | 134/26 |
| 2,220,124 | 11/1940 | Seaton .................................. | 134/11 |
| 2,310,569 | 2/1943 | Booth .................................. | 134/12 |
| 2,999,816 | 9/1961 | Bennet et al. ....................... | 252/171 |
| 3,085,918 | 4/1963 | Sherliker et al. .................... | 134/30 |
| 3,340,199 | 9/1967 | Clay et al. ........................... | 252/171 |
| 3,723,332 | 3/1973 | Barton ................................. | 252/171 |
| 3,881,949 | 5/1975 | Brock .................................. | 134/31 |

*Primary Examiner*—S. Leon Bashore
*Assistant Examiner*—M. Steven Alvo
*Attorney, Agent, or Firm*—Cushman, Carby & Cushman

[57] ABSTRACT

Contaminated articles, especially printed circuit boards, are cleaned by immersing them in the sump compartment of a cleaning tank containing a boiling mixture of a halogenated hydrocarbon solvent, especially fluorochlorohydrocarbons containing two or three carbon atoms, having a high concentration of an organic solvent, especially isopropyl alcohol, followed by rinsing them in another boiling mixture containing a lower concentration of the organic solvent but at least equal to the organic solvent concentration of the azeotrope.

42 Claims, 1 Drawing Figure

TWO TANK CLEANING PROCESS USING A CONTAMINATED CLEANING MIXTURE CAPABLE OF FORMING AN AZEOTROPE

This is a continuation of application Ser. No. 289,113 filed Sept. 14, 1972 and now abandoned.

This invention relates to a method of cleaning contaiminated articles and apparatus therefor.

It is well known that halogenated hydrocarbons can be employed as cleaning liquids for removal of various contaminants from a wide variety of articles. Thus 1,1,2-trichloro-1,2,2-trifluoroethane may be used as a cleaning fluid for removal of unwanted contaminants from the surface of synthetic organic polymers and plastics since said fluid does not attack the polymer or plastic substrate to significant extent.

However the use of printed circuits generally supported on a plastic substrate on which may be mounted components containing polymeric insulation and markings and having rosin-based soldering fluxes attached thereto has brought in a difficult crop of problems. Thus there is required a solvent or a solvent composition and method of cleaning which does not attack a plastic substrate or said components but which nevertheless will remove fluxes and flux residues which may be extremely tenacious. In this connection it has been proposed to use alcohols in admixture with the primary solvent, e.g. the said trichlorotrifluoroethane, since the alcohol is more effective than the primary solvent for removal of the fluxes and flux residues. Often azeotropic mixtures of alcohols with the primary solvent (often employed at the boil) are employed but such mixtures may not contain sufficient of the alcohol to remove the fluxes effectively. Accordingly the use of such azeotropic mixtures is by no means a complete answer to the problem. Efforts have been made to solve the problem simply by immersing the contaminated article in mixtures of the primary solvent with high concentration of alcohols well above that of the azeotropic mixture said mixture being maintained at relatively cool temperatures, that is, near to ambient temperature e.g. 20° C or less. If desired such treatment may be followed by then bringing the article into contact with a clean cold mixture of the primary solvent and alcohol in a separate tank or with a cold liquid derived by evaporation from a body of a liquid mixture followed by condensation while within a vapour zone and allowing the liquid to drain off the article. In such methods there may be quite serious loss of solvent due to an adhering layer of cold solvent on articles withdrawn from the plant and/or in that in certain applications a sufficiently high degree of removal of flux from the contaminated article may still not be effected.

Cleaning plants for treating contaminated articles may comprise a liquor tank in which the articles are immersed, the liquor tank being provided with an overflow to a sump tank. This latter tank contains a relatively small amount of liquor which is held at the boil and the purpose of the sump is not to bring the articles into contact with the liquor but to collect dirty solvent which collects in the sump. Vapour above the level of the liquor is condensed and returned to the liquor tank thereby ensuring the presence of clear solvent in the liquor tank while impure solvent overflows to the sump. The articles are withdrawn from the liquor tank then through a vapour zone and finally out of the plant. Use of hot or boiling solvent mixtures containing high concentrations of alcohol in the tanks of such plants is not effective inasmuch as there is depletion of the alcohol from the liquor tank and increase of alcohol in the sump. The system is therefore not stable and will not do the cleaning job required of it.

We now provide a method of cleaning contaminated articles which is quite distinct from what has been previously used, which method permits effective cleaning of contaminated articles at elevated temperatures, which is stable, and which avoids the pitfalls of prior processes.

According to the present invention we provide a method of cleaning a contaminated article in a system which comprises using azeotrope-forming mixture comprising a halogenated hydrocarbon solvent and an auxiliary solvent, the mixture having a concentration of the auxiliary solvent greater than that of the azeotrope, wherein the article is contacted with a first heated mixture comprising the halogenated hydrocarbon solvent and the auxiliary solvent and is subsequently rinsed with a second liquid mixture containing a lower proportion of the auxiliary solvent than is contained in the first liquid mixture.

Preferably there is introduced into the system, continuously or intermittently from an external source, a supply of a substantially azeotropic mixture of the halogenated hydrocarbon solvent and the auxiliary solvent or the appropriate proportions of the said solvents which correspond to the substantially azeotropic mixture.

According to a preferred form of carrying out the process of the invention we provide a method of cleaning a contaminated article which comprises immersing the article in said first heated liquid mixture, said mixture being contained in a sump compartment of a cleaning system and subsequently passing the article into the second liquid mixture in a rinsing compartment of said system, the first and second liquid mixtures having a common vapour zone. Preferably the second liquid mixture is also heated. This second liquid mixture is in equilibrium with (in other words its composition is substantially constant with respect to) the vapour in the vapour zone above the sump and rinsing compartments and with the said mixture in the sump compartment. A plurality of rinsing compartments may be employed if desired.

Suitably the substantially azeotropic mixture or the appropriate proportion of the halogenated hydrocarbon solvent and the auxiliary solvent which correspond to the substantially azeotropic mixture is introduced continuously or intermittently into the sump and/or rinsing compartments of the cleaning system.

In said preferred form of carrying out the present process at least part, especially all, of the liquid obtained by condensation of vapours from the common vapour zone is returned to the rinsing compartment. Most suitably it is also arranged that liquid mixture overflowing from the rinsing compartment passes to the sump compartment.

Preferably the first azeotrope-forming mixture in the sump compartment, contains at least five parts by weight (and more preferably at least 10 parts by weight) of the auxiliary solvent per hundred parts by weight of the total mixture above the proportion corresponding to the azeotrope itself.

Of the halogenated hydrocarbons which may be used in the present process there may be mentioned fluorochlorohydrocarbons especially those containing two or three carbon atoms, for example, 1,1,2,2-tetrachloro- 1,2-difluoroethane. 1,1,2-trichloro-1,2,2-trifluoroethane gives especially good results.

Examples of the auxiliary solvents which may be employed in association with the halogenated hydrocarbon solvent to give an azeotrope-forming mixture include methyl acetate, nitroparaffins (e.g. nitromethane), and alcohols, which likewise form an azeotrope with said trichlorotrifluoroethane. Thus there may be employed alcohols containing one to four carbon atoms, which include methyl alcohol, ethyl alcohol, tert-butanol and isopropyl alcohol. The last alcohol is especially useful.

The concentration of the alcohol in the halogenated hydrocarbon used in the sump and rinsing compartments can vary according to which particular halogenated hydrocarbon and which particular alcohol is employed. In the sump when using for instance 1,1,2-trichloro-1,2,2-trifluoroethane and isopropanol it is preferred that the concentration of isopropanol be less than 70% by weight.

The liquor in the rinsing tank is of different composition from that of the sump compartment. In practice the solvent mixture in the rinsing compartment, once stable conditions are established, has a concentration of the second solvent generally ranging from that of the azeotrope to not more than 11% by weight and preferably not more than 5% by weight above that of the azeotrope. This procedure of immersing the contaminated article in said heated liquid mixture in the sump compartment alone or in association with the further immersion in said heated solvent mixture in the rinsing compartment is inter alia an unusual feature of the present process. With concentrations of isopropanol in the range 10% to 70% in the sump compartment concentrations of up to 14% by weight isopropanol may be employed in the rinsing compartment. Generally concentrations of isopropanol of 10% to 40% by weight are employed in the sump and concentrations in the range 22% to 27% by weight give especially useful results. With these lower ranges in the sump compartment concentrations of up to 4% above the azeotropic mixtures are preferably employed in the rinsing compartment. As a specific instance it is found that a solvent mixture in the rinsing tank containing 5.5% isopropanol becomes substantially constant with respect to the vapour in the vapour zone above the rinsing and sump compartments and with a solvent mixture in the latter compartment having a solvent mixture containing 25% isopropanol, both mixtures being at the boil.

With 1,1,2-trichloro-1,2,2-trifluoroethane as primary solvent ethyl alcohol concentrations of 25% to 30% by weight of the solvent mixture are preferably employed in the sump compartment while with methyl alcohol concentrations of 17% to 22% by weight are preferably employed. With these concentrations in the sump mixtures the rinsing compartments preferably contain an ethyl alcohol concentration of 6% to 8% and a methyl alcohol concentration of 8% to 10% by weight.

The substantially azeotropic mixture introduced into the system may contain a concentration of the second solvent up to as high as that in the rinse tank. Good results can be obtained with mixtures of the solvents boiling within 1° or 2°C of the boiling point of the azeotrope. Very good results have been obtained when using the azeotropic mixture itself for example the azeotropic mixture consisting of 97.1% by weight 1,1,2-trichloro-1,2,2-trifluoroethane and 2.9% by weight isopropanol. Most suitably the substantially azeotropic mixture as such is introduced into the system. However, if desired, the appropriate proportions of the primary and secondary solvents, e.g. 1,1,2-trichloro-1,2,2-trifluoroethane and isopropanol which correspond to the substantially azeotropic mixture may be introduced separately into the sump and/or rinsing compartment. The amount of the substantially azeotropic mixture introduced into the system is preferably that required to maintain the levels constant in the sump and rinsing compartments.

The solvent mixtures in the sump and rinsing compartments are held at a temperature greater than ambient temperature (in some instances 20°C). Usually the mixtures are held at a temperature of at least 30°C and preferably at least 40°C. More preferably the solvent mixtures are held at the boiling point which in the case of mixtures of 1,1,2-trichloro-1,2,2-trifluoroethane are often in the range 45° to 50°C.

Other solvents or additives can be added to the solvent composition used in the present process if it is desired to modify their cleaning or solvent power. Suitable additives include cationic, anionic and non-ionic detergents. Water may also be added in some circumstances, particularly when the compositions include a detergent but this is not essential.

It is usually unnecessary to use stabilisers in the solvent mixtures. However it is possible that stabilisers may be desirable under corrosive conditions, for example those conditions in which the solvent mixtures come into contact with light metals, for example zinc and aluminium.

One advantageous feature of the present process is that the system is exceedingly stable, that is the concentrations of the secondary solvent, e.g. isopropanol in the different compartments can be effectively maintained over the whole long working life of the solvent mixtures. A uniformly high level of removal of contaminants is also effected. For example, the process has been operated on a 24 hours per day basis with intermittent cleaning of contaminated articles for a period of 220 hours, after which time the percentage by weight of isopropanol in the sump compartment was found to be substantially as at the beginning of the operation, i.e. the isopropanol content initially was 23.6% and during operation remained within the limits 23.3% to 23.9%. In the rinsing compartment the composition also remained substantially constant, the isopropanol content being initially 5.4% and remaining within the limits 5.3% to 5.6%. The present process has also the advantages that flammable situations are avoided.

The present process is useful in a wide range of applications including removal of tenacious soldering fluxes from electrical equipment. In particular it is useful for removing fluxes from equipment carried on a plastic or resin substrate while not damaging the boards or components thereon.

In another method of carrying out the process of the invention a contaminated article is contacted with said first heated liquid mixture in a cleaning system having one compartment (sump compartment), the article is withdrawn to the vapour zone above said compartment and therein is rinsed with said second liquid mixture which is first obtained by condensation of vapours from said vapour zone. In a modification of that process the contaminated article after immersion in said first heated liquid mixture is withdrawn through and out of said vapour zone, allowed to cool and is then returned to said vapour zone where it is then rinsed by said second liquid mixture derived by direct condensation of vapours from said vapour zone on to said cooled article.

In another variant of the present process the first and second liquid mixtures are in compartments separate from each other and not possessing a common vapour zone, condensed liquid from vapour above said first heated mixture being returned to the second heated mixture.

One suitable type of apparatus which can be used in the present process is shown in the accompanying drawing (FIG. 1), which represents a schematic view in vertical cross section and not to scale. In the drawing, a vessel 1 is divided into a sump compartment 2 and a rinse compartment 4 separated by wall 3. Sump compartment 2 contains a body of the first azeotrope-forming mixture as hereinbefore described, of sufficient depth for the contaminated articles to be immersed therein, and is provided with heater 5. Rinse compartment 4 adjacent to the sump compartment 2 is provided with heater 6 and contains a volume of the second liquid as hereinbefore described, of composition different from that in the sump compartment 2. Vapour zone 7 communicates with both sump and rinsing compartments 2 and 4. Cooling coil 8 is fitted in the vapour zone 7 to condense vapour, together with trough 9. The latter is for collection of condensed liquor and pipe 10 is for return of condensate to rinsing compartment 4. A cold line 11 is attached to the outside of the vessel, through which a cooling medium can be passed to provide extra cooling. An inlet 12 may be provided for feeding a substantially azeotropic mixture as hereinbefore described; it is shown in the drawing as leading into the sump compartment 2, but it can be placed so as to feed into the system at any convenient point. Means (not detailed) are also provided to transport the contaminated articles through the apparatus, the track of the articles being represented by the line beginning at the entry point 13 and leading through sump compartment 2 vapour zone 7 and rinsing compartment 4 and ending at exit point 14.

In operation, the solvent mixtures in both compartments 2 and 4 are heated and the vapours from them mix in the vapour zone 7, condense on the cooling coil 8 and flow back as liquid into rinsing compartment 4, from which excess liquid flows over wall 3 into the sump compartment 2. This continuing flow of liquid and vapour maintains a clean rinsing liquid in compartment 4 and ensures that the dirt and contamination accumulate in compartment 2, from which it may be removed in any convenient manner, for example by periodically removing all or part of the dirty liquid. The levels of liquid are maintained by adding fresh solvent mixture, as required, to make up for losses or any amounts thus removed.

The present invention includes with its scope an apparatus which comprises a vessel having a sump compartment provided with a heating device and a volume of an azeotrope-forming mixture as hereinbefore described of depth sufficient to immerse the contaminated articles, a rinsing compartment or compartments adjacent to the sump compartment and provided with a heating device or devices containing a volume of liquid as hereinbefore defined different from that in the sump compartment, said rinsing compartment being adapted to permit overflow of liquor into the sump compartment, a vapour zone communicating with both sump and rinsing compartments, cooling means adapted to permit condensation of vapour above the sump and rinsing compartments and means adapted to return condensed liquid to the rinsing compartment or compartments.

The following Examples illustrate but do not limit the invention:

EXAMPLE 1

The material to be cleaned consisted of printed circuit boards consisting of resin-bonded paper boards on which adhered a deposit of flux. The flux coating had been produced by applying one brush stroke of flux to the board, followed by 2 minutes drying at 70°C, dip soldering for 5 seconds at 250°C, followed by a 15 minute wait. The fluxes were activated rosin-based fluxes available commercially under the Trade Marks Zeva C4, Fry's R8, Fry's S64, Multicore PC25, Alpha 711, Alpha 809 and Alpha 862.

The method of cleaning was as previously described and involved dipping the contaminated articles in the sump compartment of a cleaning chamber for a period of 1 minute followed by immersion in an adjoining rinsing chamber for 10 seconds. The solvent mixture in the sump consisted of 1,1,2-trichloro-1,2,2-trifluoroethane containing 23% to 24.5% by weight of isopropanol. The mixture in the rinsing tank consisted of 94.6% by weight of said trichlorotrifluoroethane and 5.4% by weight of isopropanol. Both liquids were maintained at the boil. Vapour above the liquid levels was condensed by cooling coils and condensate was returned to the rinsing tank. An azeotropic mixture of said trichlorotrifluoroethane and said alcohol was fed into the sump at a rate which maintained the level of the liquid in the sump.

All traces of flux residues were removed by this treatment without damaging the boards.

EXAMPLE 2

The material to be cleaned and the methods of cleaning were as is described in Example 1 with the exceptions that:
 i. the solvent mixture in the sump consisted of 1,1,2-trichloro-1,2,2-trifluoroethane containing 24% to 25.5% by weight of industrial methylated spirit (96% by wt ethyl alcohol, 4% by wt methyl alcohol.
 ii. the mixture in the rinsing tank consisted of 94.6% by wt of said trichlorotrifluoroethane and 5.4% by wt industrial methylated spirit.
 iii. the azeotropic mixture fed to the sump contained 96.2% by weight of said trichlorotrifluoroethane and 3.8% by weight of industrial methylated spirit.

All traces of flux residues were removed by this treatment without damaging the boards.

EXAMPLE 3

The material to be cleaned and the methods of cleaning were as is described in Example 1 with the exceptions that
 i. the solvent mixture in the sump consisted of 1,1,2-trichloro-1,2,2-trifluoroethane containing 22.5% to 23% by weight isopropanol.
 ii. two rinsing tanks were employed, the one adjacent to the sump containing 5.4% by weight isopropanol and the one remote from the sump containing 4.7% isopropanol.

All traces of flux residues were removed by this treatment without damaging the boards.

We claim:
1. A method of cleaning a contaminated article which comprises contacting the article with a first contaminated liquid mixture which is heated to at least 30°C., removing contamination from the article and accumulating the removed contamination in the first liquid mixture, said first liquid mixture containing a fluorinated hydrocarbon solvent and an organic auxiliary solvent which together can form an azeotrope and wherein the concentration of the auxiliary solvent in the mixture is greater than that of the azeotrope itself, and subsequently rinsing the article with a second liquid mixture containing the fluorinated hydrocarbon solvent and a proportion of the auxiliary solvent which is lower than that contained in the first liquid mixture but at least equal to the auxiliary solvent concentration of the azeotrope.

2. A method as claimed in claim 1 in which there is introduced, continuously or intermittently from an external source, a supply of the fluorinated hydrocarbon solvent and the auxiliary solvent.

3. A method as claimed in claim 2 in which the supply of solvents introduced has a proportion of the auxiliary solvent from that of the azeotrope itself up to that in the second liquid mixture.

4. A method as claimed in claim 3 in which the supply of solvents introduced has a proportion corresponding substantially to the azeotrope itself.

5. A method as claimed in claim 2 in which the supply of solvents introduced consists essentially of 97.1% by weight of 1,1,2-trichloro-1,2,2-trifluoroethane and 2.9% by weight of isopropanol.

6. A method as claimed in claim 1 which comprises immersing a contaminated article in said first heated liquid mixture, said mixture being contained in a sump compartment, and subsequently passing the article into the second liquid mixture in a rinsing compartment, the first and second liquid mixtures having a common vapour zone.

7. A method as claimed in claim 6 in which the second liquid mixture is also heated.

8. A method as claimed in claim 6 in which there is introduced a supply of the fluorinated hydrocarbon solvent and the auxiliary solvent, continuously or intermittently, into the sump compartment.

9. A method as claimed in claim 6 in which at least part of the liquid obtained by condensation of vapours from the common vapour zone is returned to the rinsing compartment.

10. A method as claimed in claim 6 in which liquid mixture overflows from said rinsing compartment to said sump compartment.

11. A method as claimed in claim 6 in which there is employed a plurality of rinsing compartments.

12. A method as claimed in claim 6 in which the fluorinated hydrocarbon is 1,1,2-trichloro-1,2,2-trifluoroethane.

13. A method as claimed in claim 6 in which the auxiliary solvent is ethyl alcohol.

14. A method as claimed in claim 6 in which the auxiliary solvent is isopropyl alcohol.

15. A method as claimed in claim 1 in which the first liquid mixture contains at least five parts by weight of the auxiliary solvent per hundred parts by weight of the total mixture above the proportion corresponding to the azeotrope itself.

16. A method as claimed in claim 15 in which the first liquid mixture contains at least ten parts by weight of the auxiliary solvent per hundred parts by weight of the total mixture above the proportion corresponding to the azeotrope itself.

17. A method as claimed in claim 1 in which the fluorinated hydrocarbon solvent is a fluorochlorohydrocarbon.

18. A method as claimed in claim 17 in which the fluorochlorohydrocarbon contains 2 or 3 carbon atoms.

19. A method as claimed in claim 18 in which the fluorochlorohydrocarbon is 1,1,2-trichloro-1,2,2-trifluoroethane.

20. A method as claimed in claim 1 in which the auxiliary solvent is an alcohol containing one to four carbon atoms.

21. A method as claimed in claim 20 in which the alcohol is ethyl alcohol.

22. A method as claimed in claim 21 in which the concentration of ethyl alcohol in the first liquid mixture is 25% to 30% by weight.

23. A method as claimed in claim 22 in which the concentration of ethyl alcohol in the second liquid mixture is 5% to 8% by weight.

24. A method as claimed in claim 20 in which the alcohol is methyl alcohol.

25. A method as claimed in claim 24 in which the concentration of methyl alcohol in the first liquid mixture is 17% to 22% by weight.

26. A method as claimed in claim 25 in which the concentration of methyl alcohol in the second liquid mixture is 8% to 10% by weight.

27. A method as claimed in claim 20 in which the alcohol is tert-butanol.

28. A method as claimed in claim 20 in which the alcohol is isopropyl alcohol.

29. A method as claimed in claim 28 in which the concentration of isopropyl alcohol in the first liquid mixture is less than 70% by weight of the mixture.

30. A method as claimed in claim 29 in which the concentration of isopropyl alcohol in the first liquid mixture is 10% to 40% by weight of the mixture.

31. A method as claimed in claim 30 in which the concentration of isopropyl alcohol in the first liquid mixture is 22% to 27% by weight of the mixture.

32. A method as claimed in claim 28 in which the concentration of isopropanol in the first liquid mixture is between 10% and 70% by weight and in which the concentration of isopropanol in the second liquid mixture is from that of the azeotrope up to 14% by weight.

33. A method as claimed in claim 32 in which the concentration of isopropanol in the first liquid mixture is from 22% to 27% by weight of the mixture and in which the concentration of isopropanol in the second liquid mixture is from that of the azeotrope up to 7% by weight.

34. A method as claimed in claim 1 in which the second liquid mixture has a concentration of the auxiliary solvent ranging from that of the azeotrope to not more than 11% by weight above that of the azeotrope.

35. A method as claimed in claim 34 in which the second liquid mixture has a concentration of the auxiliary solvent ranging from that of the azeotrope to not more than 5% by weight above that of the azeotrope.

36. A method as claimed in claim 1 wherein the temperature of the second liquid mixture is at least 30°C.

37. A method as claimed in claim 36 wherein the temperature of both the first and second liquid mixtures is at least 40°C.

38. A method as claimed in claim 37 wherein the liquid mixtures comprise 1,1,2-trichloro-1,2,2-trifluoroethane and isopropanol and the temperature thereof is in the range 45° to 50°C.

39. A method as claimed in claim 1 in which the contaminated article is contacted with said first liquid mixture, withdrawn to a vapour zone above said first liquid mixture and rinsed with said second liquid mixture which is obtained by condensation of vapours from said vapour zone.

40. A method as claimed in claim 39 in which the article is immersed in said first liquid mixture, withdrawn through and out of said vapour zone, allowed to cool and then returned to said vapour zone where it is then rinsed by said second liquid mixture derived by direct condensation of vapours from said vapour zone on to said cooled article.

41. A method as claimed in claim 1 wherein said first and second liquid mixtures are in compartments separate from each other and not possessing a common vapour zone, and vapours from above said first heated mixture are condensed and returned to the second liquid mixture.

42. A method as claimed in claim 1 in which the article is a printed circuit or a component thereof contaminated with flux residues.

* * * * *